United States Patent
Watahiki et al.

(10) Patent No.: US 9,470,723 B2
(45) Date of Patent: Oct. 18, 2016

(54) PLC ANALOG OUTPUT MODULE

(75) Inventors: Masataka Watahiki, Chiyoda-ku (JP);
Masaru Hoshikawa, Chiyoda-ku (JP);
Shigeaki Takase, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/391,199

(22) PCT Filed: Apr. 9, 2012

(86) PCT No.: PCT/JP2012/059696
§ 371 (c)(1),
(2), (4) Date: Oct. 8, 2014

(87) PCT Pub. No.: WO2013/153599
PCT Pub. Date: Oct. 17, 2013

(65) Prior Publication Data
US 2015/0077132 A1    Mar. 19, 2015

(51) Int. Cl.
*G01R 31/04* (2006.01)
*G01R 27/02* (2006.01)
*H02H 3/08* (2006.01)
*H02H 5/04* (2006.01)
*G01R 19/165* (2006.01)
(Continued)

(52) U.S. Cl.
CPC ......... *G01R 19/1659* (2013.01); *G01R 31/026* (2013.01); *G01R 31/28* (2013.01); *G05B 19/058* (2013.01)

(58) Field of Classification Search
CPC ....... B65D 51/00; A61F 2/0095; A61F 2/36; G01R 19/1659; G01R 31/026; G01R 31/28; G05B 19/058

USPC ........ 324/522, 537, 538, 609; 361/93.7, 104
See application file for complete search history.

(56) References Cited

U.S. PATENT DOCUMENTS 6,556,405 B2    4/2003    Sudou et al.
6,639,776 B2    10/2003   Sudou et al.
(Continued)

FOREIGN PATENT DOCUMENTS

JP    63-155505 U    10/1988
JP    01-199213 A    8/1989
(Continued)

OTHER PUBLICATIONS

Office Action of JP 2014-509919 dated Jul. 8, 2014.
(Continued)

*Primary Examiner* — Farhana Hoque
(74) *Attorney, Agent, or Firm* — Sughrue Mion, PLLC; Richard C. Turner

(57) ABSTRACT

As a configuration for detecting an occurrence of abnormalities such as a disconnection of output wiring or an overcurrent of a PLC analog output module that controls a load by an analog current signal, the PLC analog output module includes a current output circuit that outputs the analog current signal, a current sensing resistor provided at a current output terminal of the current output circuit for directly detecting an analog current output to the load, a monitoring circuit that monitors voltages at both ends of the current sensing resistor, and an abnormality detection circuit that discriminates whether there is an occurrence of a disconnection or an overcurrent based on a monitoring result of the monitoring circuit.

3 Claims, 4 Drawing Sheets

(51) Int. Cl.
*G01R 31/02* (2006.01)
*G01R 31/28* (2006.01)
*G05B 19/05* (2006.01)

(56) References Cited

U.S. PATENT DOCUMENTS

| | | | |
|---|---|---|---|
| 2001/0009493 A1 | 7/2001 | Sudou et al. | |
| 2002/0027757 A1* | 3/2002 | Sudou | G05B 19/0425 361/93.1 |
| 2005/0243491 A1* | 11/2005 | Tanis | H02H 3/00 361/104 |

FOREIGN PATENT DOCUMENTS

| | | |
|---|---|---|
| JP | 2-202797 A | 8/1990 |
| JP | 5-217737 A | 8/1993 |
| JP | 10-149216 A | 6/1998 |
| JP | 2001-004690 A | 1/2001 |
| JP | 2001-033507 A | 2/2001 |
| JP | 2001-202109 A | 7/2001 |
| JP | 2006-048481 A | 2/2006 |
| JP | 2007-072908 A | 3/2007 |
| JP | 2007-304986 A | 11/2007 |
| JP | 2009-301418 A | 12/2009 |
| JP | 2012032359 A | 2/2012 |

OTHER PUBLICATIONS

International Search Report of PCT/JP2012/059696 dated Jun. 19, 2012.
Communication dated Nov. 14, 2014, issued by the Taiwanese Patent Office in counterpart Application No. 101137233.
Communication dated May 19, 2015, issued by the Japan Patent Office in corresponding Japanese Application No. 2014-509919.
Communication dated Dec. 16, 2014 from the Japanese Patent Office in counterpart application No. 2014-509919.
Communication dated Jan. 19, 2016, from the Japanese Patent Office in counterpart application No. 2014-509919.
Communication dated Feb. 3, 2016 from the Intellectual Property Office of the P.R.C. issued in corresponding Application No. 201280072233.1.
Communication dated Apr. 28, 2016 from the Korean Intellectual Property Office issued in corresponding Application No. 10-2014-7028001.
Communication dated Oct. 15, 2015 from the Korean Patent Office in counterpart application No. 10-2014-7028001.

* cited by examiner

PLC ANALOG OUTPUT MODULE

CROSS REFERENCE TO RELATED APPLICATIONS

This is a National Stage of International Application No. PCT/JP2012/059696 filed Apr. 9, 2012, the contents of which are incorporated herein by reference in its entirety.

FIELD

The present invention relates to a PLC (Programmable Logic Controller) analog output module that controls a load such as a valve by an analog current signal.

BACKGROUND

A load control method of a PLC analog output module includes a method of controlling a load by an analog current signal and a method of controlling a load by an analog voltage signal, and these methods respective have advantages and disadvantages as described below.

An analog current signal has strong resistance to noise and has the same current value at any position in a control loop that does not branch in the middle, and thus even a remote load can be accurately controlled. However, because it is a current control, its current consumption is large.

On the other hand, an analog voltage signal is vulnerable to noise and a voltage drop occurs due to resistance components of an electric cable and a terminal, and thus a remote load cannot be controlled accurately. However, because it is a voltage control, its current consumption is small.

In a PLC analog output module used in a PLC system where high reliability is required, occurrence of abnormalities such as disconnection of output wiring and short circuit of an output circuit needs to be detected. In this regard, in the PLC analog output module that uses the method of controlling a load by an analog voltage signal, there has been known a technique of detecting occurrence of abnormalities (see, for example, Patent Literature 1).

CITATION LIST

Patent Literature

Patent Literature 1: Japanese Patent Application Laid-open No. 2009-301418

SUMMARY

Technical Problem

However, in the PLC analog output module that uses the method of controlling a load by an analog current signal, there has been no known technique of detecting occurrence of abnormalities such as disconnection of output wiring or an overcurrent output due to short circuit of a current output circuit by the module itself, because of the configuration of its current output circuit. Therefore, conventionally, when output wiring is disconnected, a method of detecting and handling the disconnection by a counterpart device (or a user), which is a receiver of the signal, has been generally used.

Therefore, to improve the reliability of the PLC system, it has been desired that occurrence of abnormalities can be detected by the PLC analog output module itself that uses the method of controlling a load by an analog current signal, which is a sender of the signal.

The present invention has been achieved in view of the above aspects, and an object of the present invention is to provide a PLC analog output module that can detect the occurrence of abnormalities such as a disconnection of output wiring or an overcurrent output of a PLC analog output module that controls a load by an analog current signal.

Solution to Problem

The present invention is directed to a PLC analog output module for controlling a load by an analog current signal, which achieves the object. The PLC analog output module includes a current output circuit that outputs the analog current signal; a current sensing resistor provided at a current output terminal of the current output circuit for directly detecting an analog current output to the load; a monitoring circuit that monitors voltages at both ends of the current sensing resistor; and an abnormality detection circuit that discriminates whether there is an occurrence of a disconnection or an overcurrent based on a monitoring result of the monitoring circuit.

Advantageous Effects of Invention

According to the present invention, the occurrence of abnormalities such as a disconnection of output wiring or an overcurrent output of a PLC analog output module that controls a load by an analog current signal can be detected, and thus the reliability of a PLC system that uses the PLC analog output module can be improved.

DESCRIPTION OF EMBODIMENTS

Exemplary embodiments of a PLC analog output module according to the present invention will be explained below in detail with reference to the accompanying drawings. The present invention is not limited to the embodiments.

Embodiment

Figure 1:
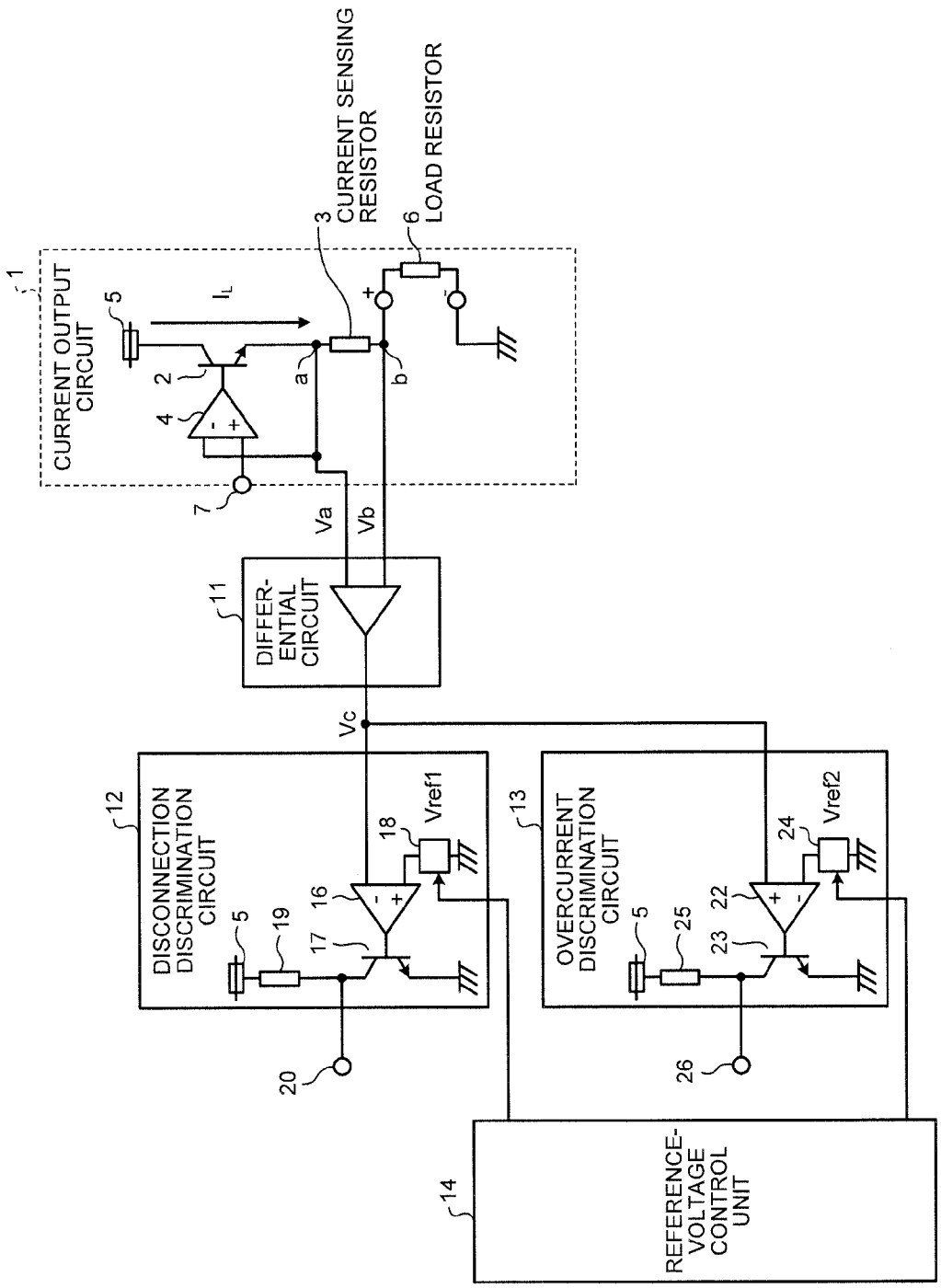
FIG. 1 is a circuit diagram depicting a configuration of an abnormality detection system in a current output circuit of a PLC analog output module according to an embodiment of the present invention.

FIG. 1 is a circuit diagram depicting a configuration of an abnormality detection system in a current output circuit of a PLC analog output module according to an embodiment of the present invention.

In FIG. 1, a current output circuit 1 of the PLC analog output module according to the present embodiment includes a transistor 2 that outputs a current $I_L$ to a load, a current sensing resistor 3 that detects the output current $I_L$, and an amplifier 4 that controls the transistor 2.

In the transistor 2, a collector terminal is connected to a power supply 5, an emitter terminal is connected to one end of the current sensing resistor 3, and a base terminal is connected to an output terminal of the amplifier 4. The other end of the current sensing resistor 3 is connected to one end of a load resistor 6 that represents a control target (a load) such as a valve, and the other end of the load resistor 6 is connected to a circuit ground. A control voltage is applied to one input terminal (+) of the amplifier 4 from an input terminal 7, and a voltage formed by the load resistor 6 is applied to the other input terminal (−) as a feedback voltage.

With this configuration, an analog current signal (the output current $I_L$) is supplied from the current output circuit 1 to the load (the load resistor 6) so as to follow the control voltage input from the input terminal 7 to the base terminal of the transistor 2. The abnormality detection system in the current output circuit 1 includes a differential circuit 11, a disconnection discrimination circuit 12, an overcurrent discrimination circuit 13, and a reference-voltage control module 14.

The differential circuit 11 is a circuit that monitors a voltage between both ends of the current sensing resistor 3. The differential circuit 11 compares a voltage Va at a connection terminal "a" between the emitter terminal of the transistor 2 and one end of the current sensing resistor 3 with a voltage Vb at a connection terminal "b" between the other end of the current sensing resistor 3 and one end of the load resistor 6 to perform discrimination, and outputs a differential voltage Vc as a discrimination result to the disconnection discrimination circuit 12 and the overcurrent discrimination circuit 13 in parallel.

The disconnection discrimination circuit 12 includes a comparison circuit 16, a transistor 17, and a reference voltage supply 18. The differential voltage Vc is input to a negative input terminal (−) of the comparison circuit 16. The reference voltage supply 18 is provided between a positive input terminal (+) of the comparison circuit 16 and the circuit ground. A base terminal of the transistor 17 is connected to an output terminal of the comparison circuit 16, a collector terminal of the transistor 17 is connected to the power supply 5 via a resistor 19, and an emitter terminal of the transistor 17 is connected to the circuit ground. An output terminal 20 of the disconnection discrimination circuit 12 is pulled out from the collector terminal of the transistor 17.

The overcurrent discrimination circuit 13 has the same circuit configuration as that of the disconnection discrimination circuit 12, and includes a comparison circuit 22, a transistor 23, and a reference voltage supply 24. The differential voltage Vc is input to the positive input terminal (+) of the comparison circuit 22. The reference voltage supply 24 is provided between the negative input terminal (−) of the comparison circuit 22 and the circuit ground. A base terminal of the transistor 23 is connected to an output terminal of the comparison circuit 22, a collector terminal of the transistor 23 is connected to the power supply 5 via a resistor 25, and an emitter terminal of the transistor 23 is connected to the circuit ground. An output terminal 26 of the overcurrent discrimination circuit 13 is pulled out from the collector terminal of the transistor 23.

The reference-voltage control module 14 separately controls a reference voltage Vref1 of the reference voltage supply 18 in the disconnection discrimination circuit 12 and a reference voltage Vref2 of the reference voltage supply 24 in the overcurrent discrimination circuit 13. The reference-voltage control module 14 can be constituted by, for example, an MPU (microcomputer), so that the reference voltages Vref1 and Vref2 can be set and changed by a program control.

An abnormality detection operation related to the present embodiment is explained next.

<Disconnection Detection Operation>

Generally, when an analog current is output to the load, a load current $I_L$ flows through the current sensing resistor 3 and the load resistor 6. The differential circuit 11 can detect the load current $I_L$ flowing through the current sensing resistor 3 as the differential voltage Vc between the potential Va at the connection terminal "a" and the potential Vb at the connection terminal "b". The differential voltage Vc can be calculated by Vc=Va−Vb.

The disconnection discrimination circuit 12 compares the differential voltage Vc with the reference voltage Vref1, and if Vc<Vref1 is established, the disconnection discrimination circuit 12 sets the output terminal 20 to an "H" level and discriminates that disconnection has occurred. For example, it is assumed here that a resistance value of the current sensing resistor 3 is 100Ω, the reference voltage Vref is 0.1 volt (V), and wiring on the positive (+) side connected to the load resistor 6 is disconnected. At this time, an electric current stops flowing through the current sensing resistor 3, and the potential Va at the connection terminal "a" and the potential Vb at the connection terminal "b" become the same potential. Therefore, because Vc=0 and Vref1=0.1 V, Vc becomes lower than Vref1 (Vc<Vref1), and thus occurrence of disconnection can be determined. The disconnection discrimination circuit 12 then sets the output terminal to an "H" level.

The above example is an operation when wiring is completely disconnected. Meanwhile, for example, when a user wishes to determine that disconnection has occurred by the load current $I_L$ of 2 mA (milliampere), this can be realized by controlling and setting the reference voltage Vref1 as 0.2 V by the reference-voltage control module 14. In this manner, occurrence of disconnection can be also determined by a determination value that is preferred by a user.

<Overcurrent Detection Operation>

Similarly to the disconnection detection operation, an overcurrent detection operation uses the differential voltage Vc detected by the differential circuit 11. That is, the overcurrent discrimination circuit 13 compares the difference voltage Vc with the reference voltage Vref2, and if Vc>Vref2 is established, the overcurrent discrimination circuit 13 sets the output terminal 26 to an "H" level, and determines that overcurrent has occurred.

For example, it is assumed here that the transistor 2 of the current output circuit 1 has had a short-circuit failure. At this time, an overcurrent may flow through the current sensing resistor 3 and the load resistor 6. For example, when it is assumed that the current output circuit 1, which normally outputs 20 mA, has output 30 mA (an overcurrent has flowed), the differential voltage Vc between the connection terminal "a" and the connection terminal "b" at that time indicates that an overcurrent of 10 mA has occurred.

Furthermore, when a user wishes to determine occurrence of overcurrent at an arbitrary determination value, the occurrence of overcurrent can be determined by a determination value based on user's preference, by controlling the reference voltage Vref2 by the reference-voltage control module 14.

As described above, according to the present embodiment, occurrence of abnormalities such as disconnection of output wiring and an overcurrent output of a PLC analog output module that controls a load by an analog current signal can be detected, and abnormality detection according to the usage environment of a user can be performed.

Figure 2:
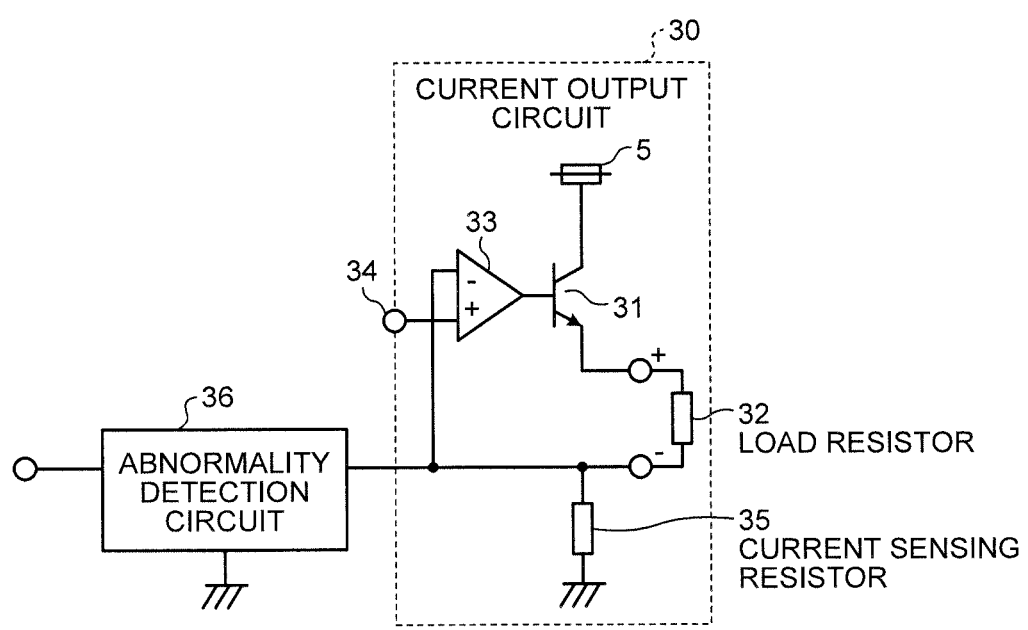
FIG. 2 is a circuit diagram for explaining an abnormality detection method using a general current output circuit, the method being shown as a comparative example.
Figure 3:
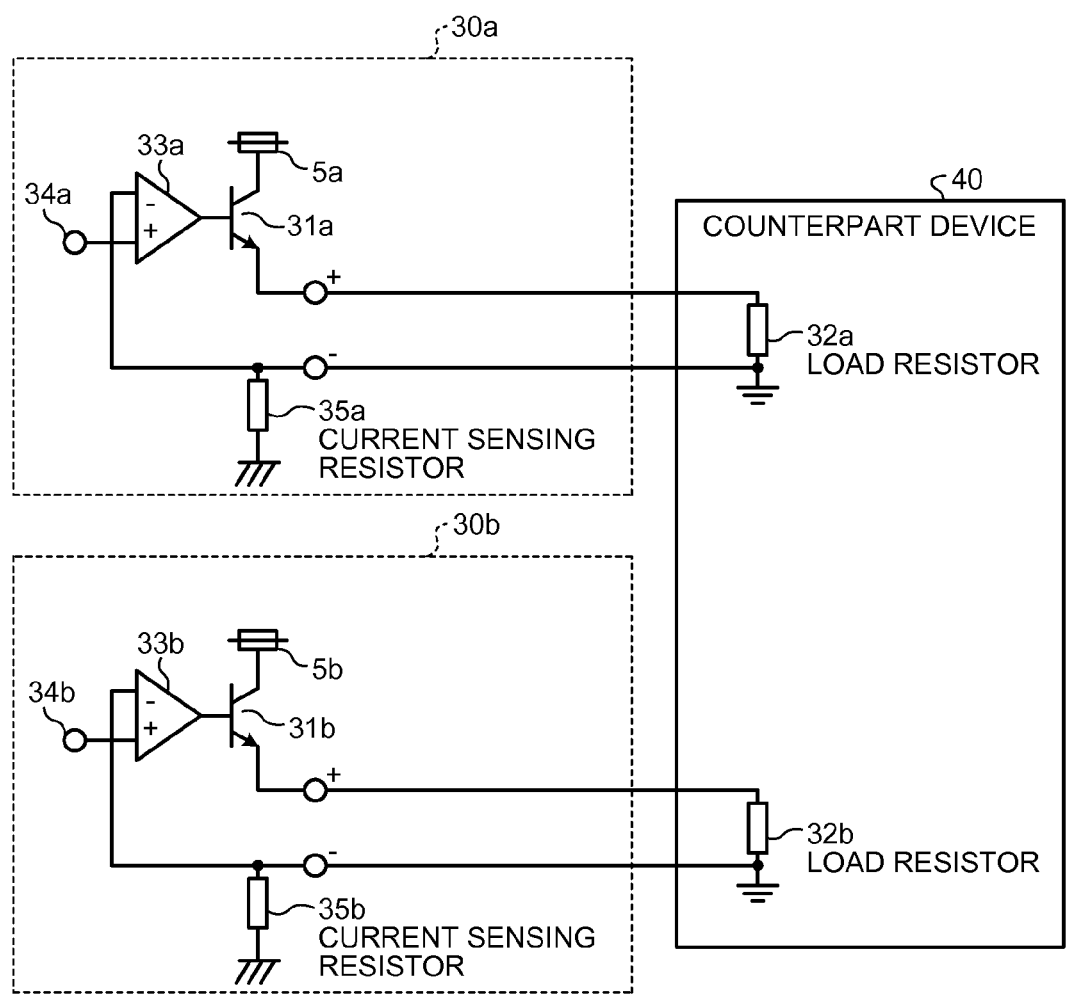
FIG. 3 is an explanatory diagram of problems when the current output circuit shown in FIG. 2 is provided for a plurality of channels.
Figure 4:
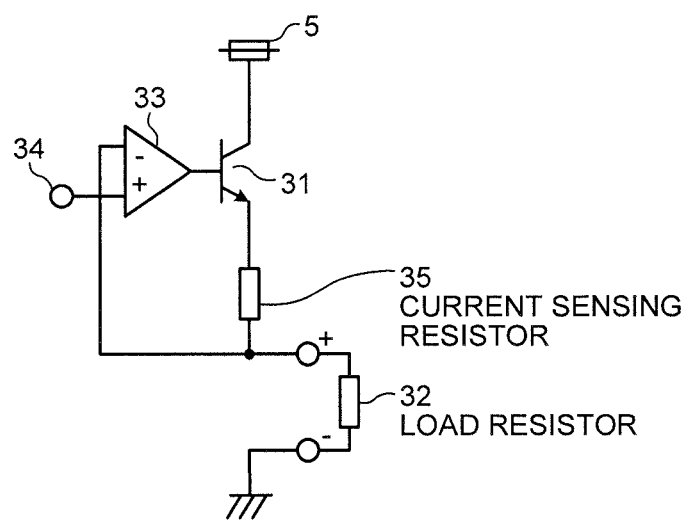
FIG. 4 is a circuit diagram of a current output circuit used in a PLC analog output module having a configuration of a plurality of channels.

Next, a significance of the present embodiment is explained with reference to FIG. 2 to FIG. 4. FIG. 2 is a circuit diagram for explaining an abnormality detection method using a general current output circuit, the method being shown as a comparative example. FIG. 3 is an explanatory diagram of problems when the current output circuit shown in FIG. 2 is provided for a plurality of channels. FIG. 4 is a circuit diagram of a current output circuit used in a PLC analog output module having a configuration of a plurality of channels.

As shown in FIG. 2, a general current output circuit 30 includes a transistor 31 with a collector terminal thereof being connected to the power supply 5, a load resistor 32 with one end thereof being connected to an emitter terminal of the transistor 31, and an amplifier 33. In the amplifier 33, a control voltage applied to an input terminal 34 is input to one input terminal (+), and a feedback voltage generated by the load resistor 32 is input to the other input terminal (−), and an output terminal is connected to a base terminal of the transistor 31.

In the current output circuit 30, a current sensing resistor 35 is provided between the other end of the load resistor 32 and the circuit ground, and if an abnormality detection circuit 36 is connected to a connection terminal between the other end of the load resistor 32 and the current sensing resistor 35, disconnection and an overcurrent output can be detected.

However, a PLC analog output module generally includes current output circuits for a plurality of channels, and therefore, for example, as shown in FIG. 3, when the PLC analog output module includes two current output circuits 30a and 30b, and load resistors 32a and 32b connected to the output wiring thereof are arranged in one counterpart device 40, a negative side of the load resistors 32a and 32b may be commonly earthed to the ground in the counterpart device 40.

In such a case, for example, because the negative sides of the load resistors 32a and 32b are commonly grounded, a feedback current to the current output circuit 30a in a channel #1 interferes with a feedback current to the current output circuit 30b in a channel #2, and then flows through a current sensing resistor 35a. Accordingly, the current output circuits 30a and 30b may not be able to output an electric current correctly.

Therefore, conventionally, the current output circuit having the general configuration shown in FIG. 2 cannot be adopted for a PLC analog output module having a configuration of a plurality of channels. A circuit configuration shown in FIG. 4 in which positions of the load resistor 32 and the current sensing resistor 35 in FIG. 2 are reversed is adopted, so that there will be no problem even if the load resistor is grounded in a counterpart device. That is, the current output circuit 1 shown in FIG. 1 is conventionally adopted.

However, in the configuration of the current output circuit 1 shown in FIG. 1, at the time of detecting disconnection and an overcurrent output, because one side of the current sensing resistor 3 is not connected to the ground, the potential between both ends of the current sensing resistor 3 varies depending on the size of the value of the load resistor 6 and the size of the output current $I_L$, thereby making it difficult to detect occurrence of disconnection and an overcurrent output. Therefore, conventionally, detection of occurrence of disconnection is performed by a counterpart device, and thus improvements therefor have been demanded.

According to the present embodiment, the abnormality detection system is configured as shown in FIG. 1, while focusing on the fact that a potential between both ends of the current sensing resistor 3 indicates a potential corresponding to occurrence of disconnection or an overcurrent output, so that the output module itself can detect abnormality, even if the potential between both ends of the current sensing resistor 3 varies depending on the values of the load resistor 6 and the output current $I_L$.

INDUSTRIAL APPLICABILITY

As described above, the PLC analog output module according to the present invention can detect occurrence of abnormalities such as disconnection of output wiring or an overcurrent output of a PLC analog output module that controls a load by an analog current signal, and thus the PLC analog output module according to the present invention is useful as a PLC analog output module can improve the reliability of a PLC system that uses the PLC analog output module.

REFERENCE SIGNS LIST 1 current output circuit
2, 17, 23 transistor
3 current sensing resistor
4 amplifier
5 power supply
6 load resistor that represents load (control target)
7 input terminal
11 differential circuit (monitoring circuit)
12 disconnection discrimination circuit
13 overcurrent discrimination circuit
14 reference-voltage control module
16, 22 comparison circuit
18, 24 reference voltage supply
19, 25 resistor

The invention claimed is:

1. A PLC analog output module for controlling a load by an analog current signal, comprising:
   a current output circuit that outputs the analog current signal;
   a current sensing resistor provided at a current output terminal of the current output circuit and on a side of a higher potential than the load, the load being provided between the current sensing resistor and ground, the current sensing resistor directly detecting an analog current output to the load;
   a differential circuit that outputs a differential voltage of voltages at both ends of the current sensing resistor;
   an abnormality detection circuit that receives the differential voltage output from the differential circuit and discriminates whether there is an occurrence of a disconnection and an occurrence of and overcurrent based on a determination result as to whether the differential voltage is equal to or lower than a determination value; the abnormality detection circuit using the differential voltage output commonly to discriminate the occurrence of the disconnection and the occurrence of the overcurrent; and
   a control module that changes and sets the determination value to be compared with the differential voltage in the abnormality detection circuit.

2. The PLC analog output module according to claim 1, wherein the abnormality detection circuit includes a disconnection discrimination circuit comprised of a comparison circuit that discriminates the occurrence of the disconnection based on whether the differential voltage is equal to or lower than the determination value.

3. The PLC analog output module according to claim 1, wherein the abnormality detection circuit includes an overcurrent discrimination circuit comprised of a comparison circuit that discriminates the occurrence of an overcurrent output based on whether the differential voltage exceeds the determination value.

\* \* \* \* \*